United States Patent
Pan et al.

(10) Patent No.: US 9,502,502 B2
(45) Date of Patent: Nov. 22, 2016

(54) SEMICONDUCTOR DEVICES AND METHODS OF MANUFACTURE THEREOF

(71) Applicants: Taiwan Semiconductor Manufacturing Company, Ltd., Hsin-Chu (TW); National Chiao Tung University, Hsinchu (TW)

(72) Inventors: Samuel C. Pan, Hsin-Chu (TW); Chao-Hsin Chien, Hsin-Chu (TW); Chen-Han Chou, Hsin-Chu (TW)

(73) Assignees: Taiwan Semiconductor Manufacturing Company, Ltd., Hsin-Chu (TW); National Chiao Tung University, Hsin-Chu (TW)

( * ) Notice: Subject to any disclaimer, the term of this patent is extended or adjusted under 35 U.S.C. 154(b) by 0 days.

(21) Appl. No.: 14/658,719

(22) Filed: Mar. 16, 2015

(65) Prior Publication Data

US 2016/0276436 A1    Sep. 22, 2016

(51) Int. Cl.
  *H01L 21/00*  (2006.01)
  *H01L 29/00*  (2006.01)
  *H01L 29/08*  (2006.01)
  *H01L 21/02*  (2006.01)
  *H01L 29/06*  (2006.01)
  *H01L 29/66*  (2006.01)
  *H01L 21/308*  (2006.01)
  *H01L 29/78*  (2006.01)

(52) U.S. Cl.
  CPC ....... *H01L 29/0847* (2013.01); *H01L 21/0206* (2013.01); *H01L 21/0257* (2013.01); *H01L 21/02274* (2013.01); *H01L 21/02623* (2013.01); *H01L 21/02631* (2013.01); *H01L 21/02636* (2013.01); *H01L 21/308* (2013.01); *H01L 29/0653* (2013.01); *H01L 29/66545* (2013.01); *H01L 29/66568* (2013.01); *H01L 29/66795* (2013.01); *H01L 29/78* (2013.01); *H01L 29/7851* (2013.01)

(58) Field of Classification Search
  CPC ............. H01L 21/308; H01L 21/0206; H01L 21/02274; H01L 21/02636; H01L 21/0257; H01L 21/02623; H01L 21/02631; H01L 29/0847; H01L 29/0653; H01L 29/66795; H01L 29/78; H01L 29/66545; H01L 29/7851; H01L 29/66568
  See application file for complete search history.

(56) References Cited

U.S. PATENT DOCUMENTS

| | | | |
|---|---|---|---|
| 6,346,729 B1 * | 2/2002 | Liang | H01L 29/0653 257/344 |
| 7,667,271 B2 | 2/2010 | Yu et al. | |
| 7,910,453 B2 | 3/2011 | Xu et al. | |
| 8,377,779 B1 | 2/2013 | Wang | |
| 8,399,931 B2 | 3/2013 | Liaw et al. | |
| 8,652,894 B2 | 2/2014 | Lin et al. | |
| 8,686,516 B2 | 4/2014 | Chen et al. | |

(Continued)

OTHER PUBLICATIONS

Quirk, "Semiconductor manufacturing technology", 2001, Prentice-Hall, p. 278. Dec. 2001.*

*Primary Examiner* — Nikolay Yushin
(74) *Attorney, Agent, or Firm* — Slater Matsil, LLP

(57) ABSTRACT

Semiconductor devices and methods of manufacture thereof are described. In an embodiment, a method of manufacturing a semiconductor device may include: patterning a substrate to have a first region and a second region extending from the first region of the substrate; depositing an isolation layer over a surface of the first region of the substrate; and epitaxially forming source/drain regions over the isolation layer and adjacent to sidewalls of the second region of the substrate.

20 Claims, 14 Drawing Sheets

(56) References Cited

U.S. PATENT DOCUMENTS

| | | |
|---|---|---|
| 8,716,765 B2 | 5/2014 | Wu et al. |
| 8,723,272 B2 | 5/2014 | Liu et al. |
| 8,729,607 B2 * | 5/2014 | Itokawa ............... H01L 29/7853 257/213 |
| 8,729,627 B2 | 5/2014 | Cheng et al. |
| 8,735,993 B2 | 5/2014 | Lo et al. |
| 8,736,056 B2 | 5/2014 | Lee et al. |
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,142,673 B2 * | 9/2015 | Liu ........................ H01L 29/785 |
| 2013/0248927 A1 * | 9/2013 | Wu ........................ H01L 29/78 257/190 |
| 2014/0001574 A1 | 1/2014 | Chen et al. |
| 2014/0110755 A1 | 4/2014 | Colinge |
| 2014/0151812 A1 | 6/2014 | Liaw |
| 2015/0035018 A1 * | 2/2015 | Liu ........................ H01L 29/785 257/288 |

\* cited by examiner

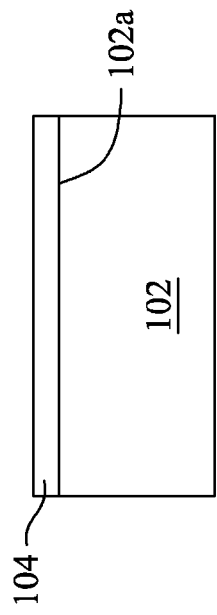
Figure 1A
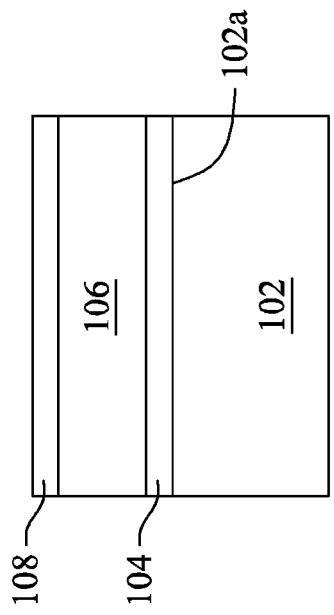
Figure 1B
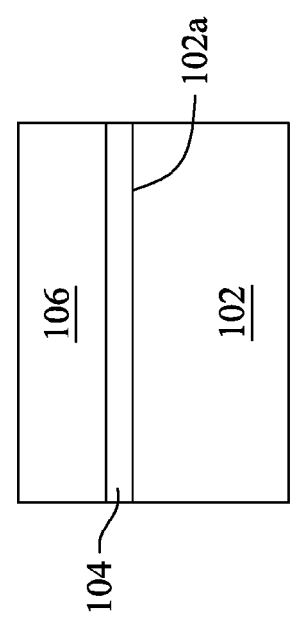
Figure 1C
Figure 1D

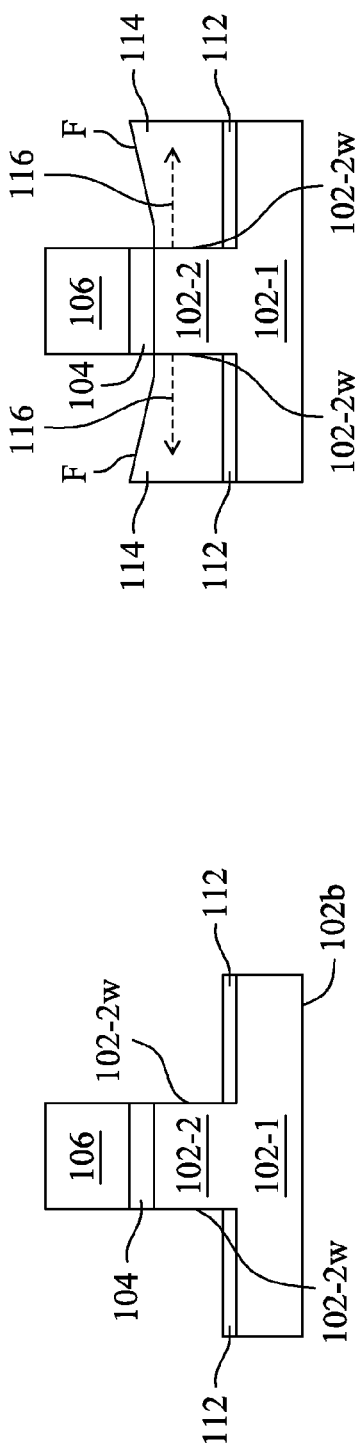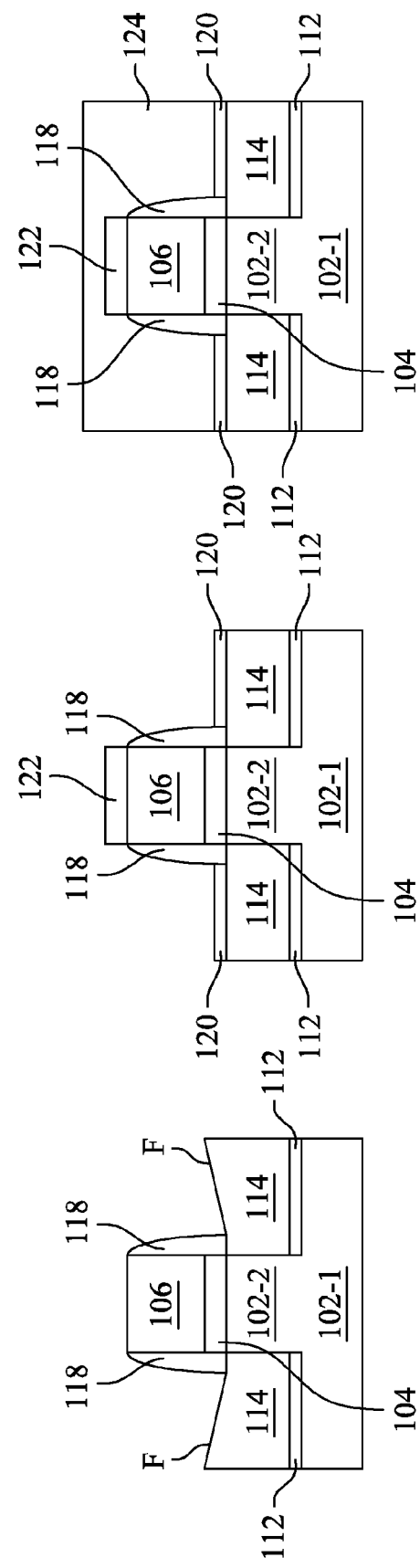

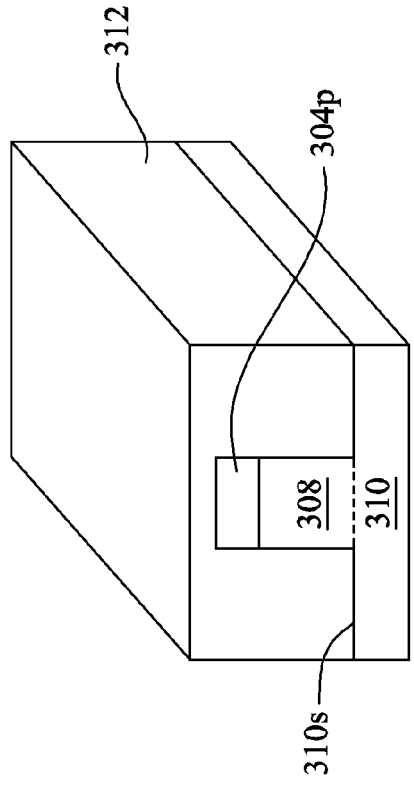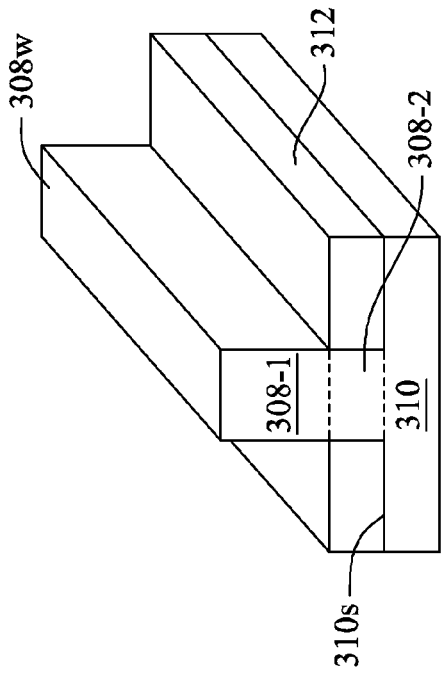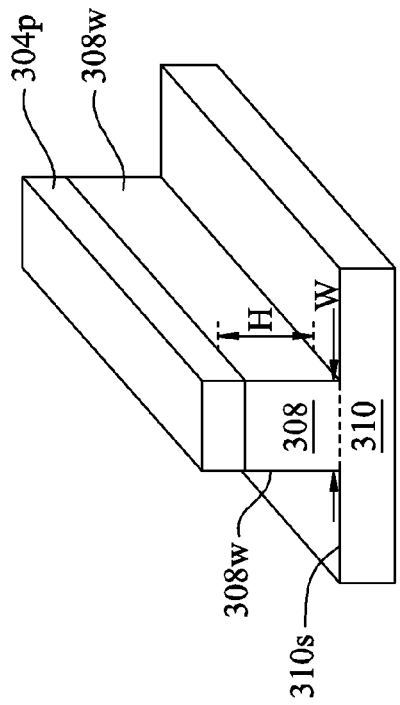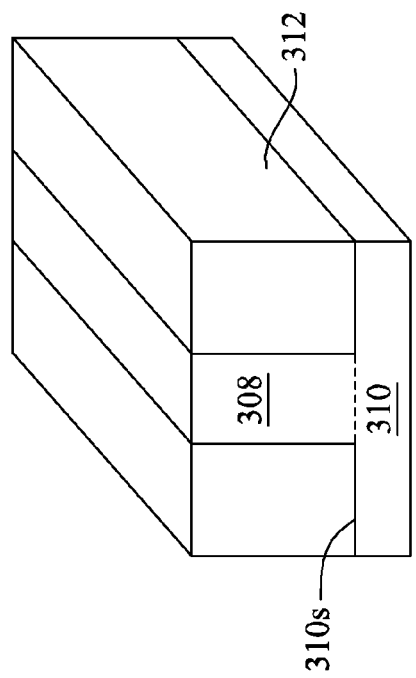
Figure 3E
Figure 3F
Figure 3G
Figure 3H

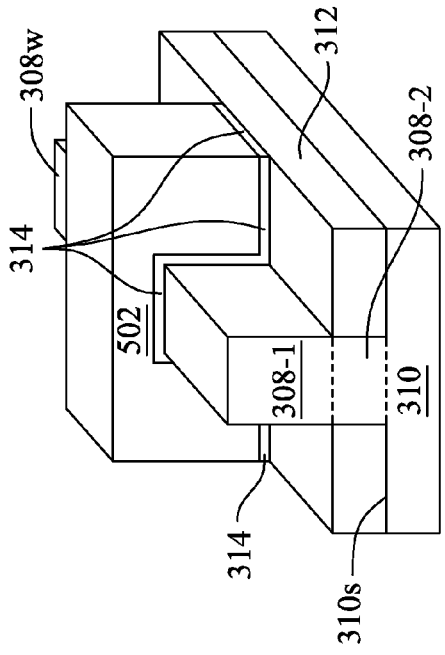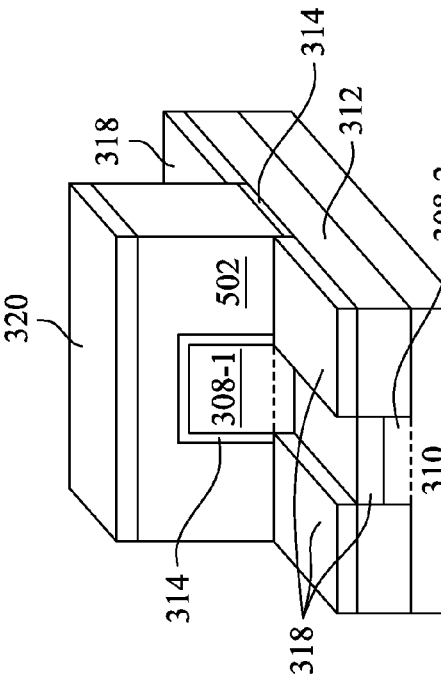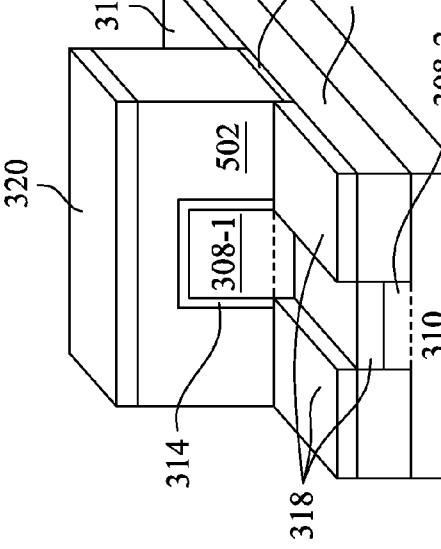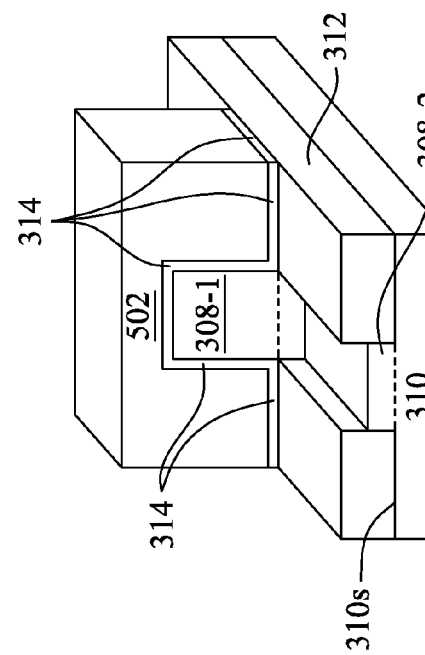
Figure 5A
Figure 5B
Figure 5C
Figure 5D

SEMICONDUCTOR DEVICES AND METHODS OF MANUFACTURE THEREOF

BACKGROUND

Semiconductor devices are used in a variety of electronic applications, such as computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

A transistor is an element that is utilized extensively in semiconductor devices. There may be thousands of transistors on a single integrated circuit (IC) in some applications, for example. One common type of transistor used in semiconductor device fabrication is a metal oxide semiconductor field effect transistor (MOSFET).

Multiple gate field-effect transistors (MuGFETs) are a recent development in semiconductor technology which typically are MOSFETs that incorporate more than one gate into a single device. The multiple gates may be controlled by a single gate electrode, where the multiple gate surfaces act electrically as a single gate. The multiple gates may also be controlled by independent gate electrodes. One type of MuGFET is referred to as a fin field effect transistor (FinFET) device, which is a transistor structure with a fin-like semiconductor channel that is raised vertically out of the silicon surface of an integrated circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 1M show a method illustrating various intermediary steps of manufacturing a planar MOSFET using a gate-first process, in accordance with some embodiments.

FIGS. 3A to 3L show a method illustrating various intermediary steps of manufacturing a FinFET using a gate-first process, in accordance with some embodiments.

FIGS. 5A to 5E show a method illustrating various intermediary steps of manufacturing a FinFET using a gate-last process, in accordance with some embodiments.

DETAILED DESCRIPTION

Figure 1E:
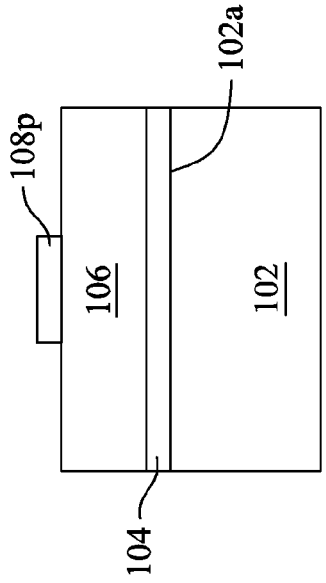
Figure 1F:
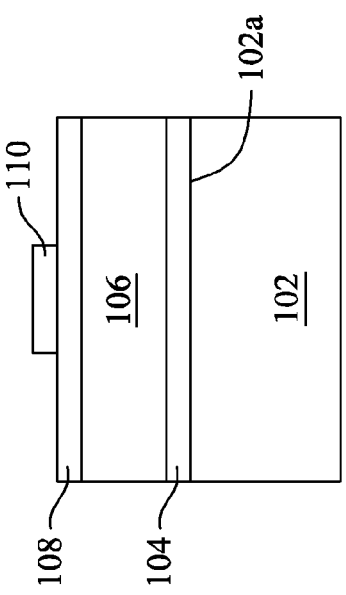

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A to 1M show a process flow illustrating various intermediary steps of manufacturing a semiconductor device, in accordance with one or more embodiments. The process flow shown in FIGS. 1A to 1M may, for example, be a gate-first process that may be used to manufacture a planar metal oxide semiconductor field effect transistor (MOSFET). FIG. 1A shows a substrate 102 having a first side 102a and a second side 102b opposite the first side 102a. As an example, the first side 102a and the second side 102b of the substrate 102 may be a top side and a bottom side of the substrate 102, respectively. The substrate 102 may, as an example, be a semiconductor wafer. The substrate 102 may comprise a semiconductor material. The semiconductor material may include an elementary semiconductor (e.g. including silicon and/or germanium in crystal), a compound semiconductor (e.g. including at least one of silicon carbide, gallium arsenic, gallium phosphide, indium phosphide, indium arsenide, or indium antimonide), an alloy semiconductor (e.g. including at least one of SiGe, GaAsP, AlInAs, AlGaAs, GaInAs, GaInP, or GaInAsP), or combinations thereof.

The semiconductor material of the substrate 102 may be doped. For example, in an embodiment where the semiconductor device being manufactured is a PMOS device (e.g. a PMOS planar MOSFET), the semiconductor material of the substrate 102 may contain N-type dopants (such as phosphorous or arsenic). However, in an embodiment where the semiconductor device being manufactured is an NMOS device (e.g. an NMOS planar MOSFET), the semiconductor material of the substrate 102 may contain P-type dopants. In some embodiments, the P-type dopants may include indium. In other embodiments, the P-type dopants may include boron or gallium. A dopant concentration of the semiconductor material of the substrate 102 may be less than about $1 \times 10^{18}$ cm$^{-3}$ (e.g. in a range from about $1 \times 10^{12}$ cm$^{-3}$ to about $1 \times 10^{16}$ cm$^{-3}$). As another example, for scaling devices, the dopant concentration can be controlled to be in a range from about $1 \times 10^{16}$ cm$^{-3}$ to about $1 \times 10^{18}$ cm$^{-3}$. However, it is noted that other dopant concentrations may be possible as well.

Referring to FIG. 1B, a first gate dielectric 104 may be formed over the first side 102a of the substrate 102. The first gate dielectric 104 may comprise an oxide (e.g. silicon oxide), a nitride (e.g. silicon nitride), or multilayers thereof. Additionally or alternatively, the first gate dielectric 104 may include a high-k dielectric material. In such embodiments, the first gate dielectric 104 may include a metal oxide or a silicate of hafnium (Hf), aluminum (Al), zirconium (Zr), lanthanum (La), magnesium (Mg), barium (Ba), titanium (Ti), lead (Pb), combinations thereof, or the like. The first gate dielectric 104 may be formed by an oxidation process (e.g. wet and/or dry oxidation), spin-on-dielectric (SOD) process, chemical vapor deposition (CVD), physical vapor deposition (PVD), atomic layer deposition (ALD), combinations thereof, variations thereof, or the like.

Referring to FIG. 1C, a first gate electrode 106 may be formed over the first gate dielectric 104 (e.g. on a side of the first gate dielectric 104 facing away from the first side 102a of the substrate 102). The first gate electrode 106 may comprise be a conductive structure comprising a conductive material. As an example, the first gate electrode 106 may comprise a layer of metal formed over the first gate dielectric 104, which can be a single layer or a multilayer structure. The first gate electrode 106 may comprise Al, Cu, W, Ti, Ta, TiN, TiAl, TiAlN, TaN, NiSi, CoSi, other conductive materials with a work function compatible with the semiconductor material of the substrate 102, combinations thereof, or the like. Alternatively, or additionally, the first gate electrode 106 can comprise polysilicon (e.g. a polysilicon layer) that may be doped such that the first gate electrode 106 is an electrically conductive structure. In the present embodiment, the first gate electrode 106 comprises a uniform thickness in the range of about 20 nanometers to about 80 nanometers, although other thicknesses may be possible as well. The first gate electrode 106 may be formed using a suitable process such as ALD, CVD, PVD, plating, combinations thereof, or the like.

In the process steps that follow, opposing regions (e.g. a left region and a right region) of the first gate electrode 106 and the first gate dielectric 104 may be removed to expose portions of the first side 102a of the substrate 102. In other words, the first gate electrode 106 and the first gate dielectric 104 may be patterned, e.g. using a masking and etching process (e.g. a dry and/or wet etch process). As shown in FIG. 1D, a first hard mask 108 may initially be formed over the first gate electrode 106. The first hard mask 108 may completely cover the surfaces of the first gate electrode 106 facing away from the substrate 102. The first hard mask 108 may be formed using a suitable process such as CVD, plasma enhanced CVD (PECVD), ALD, or the like. However, other suitable methods of forming the first hard mask 108 may be utilized. In an embodiment, the first hard mask 108 comprises a dielectric material such as silicon nitride, titanium nitride, silicon oxynitride, combinations thereof, or the like. However, it should be understood that the first hard mask 108 may comprise other suitable materials. The first hard mask 108 may be formed to a thickness of between about 10 nm and about 40 nm, such as about 25 nm.

Once the first hard mask 108 has been formed, peripheral portions of the first hard mask 108 may be removed in order to expose surfaces of peripheral portions of the first gate electrode 106. As shown in the example of FIG. 1E, the first hard mask 108 may be patterned by initially forming a patterned first photoresist 110 over a central portion of the first hard mask 108, while the peripheral portions of the first hard mask 108 are free from the patterned first photoresist 110. The patterned first photoresist 110 may be formed by depositing a photoresist material over the first hard mask 108 and subsequently patterning the photoresist material (e.g. using a lithographic process such as a photo-lithographic process) to yield the patterned first photoresist 110. The photoresist material may be deposited over the first hard mask 108 using spin-on coating, CVD, PECVD, or the like.

Following the formation of the patterned first photoresist 110, the first hard mask 108 may be patterned using the patterned first photoresist 110 as a mask. In other words, the peripheral portions of the first hard mask 108 may be removed, while leaving behind the central portion of the first hard mask 108, e.g. the portion of the first hard mask 108 disposed beneath the patterned first photoresist 110. The result of this processing step is a patterned first hard mask 108p, shown in FIG. 1F. In an embodiment, an etching process (e.g. a reactive ion etching process) that utilizes etchants suitable for the material of the first hard mask 108 may be used to pattern the first hard mask 108. However, other suitable processes for patterning the first hard mask 108 may also be used. The patterning of the first hard mask 108 may continue until the surfaces of the peripheral regions of the first gate electrode 106 are exposed. Following this, the patterned first photoresist 110 may be removed using, for example, a stripping process (e.g. a wet strip process) or an ashing process (e.g. plasma ashing process).

Figure 1G:
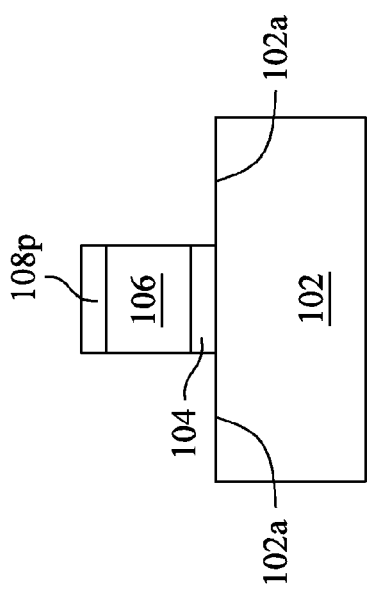

Thereafter, as shown in FIG. 1G, the pattern of the patterned first hard mask 108p may be transferred to the first gate electrode 106 and the first gate dielectric 104 using a suitable etching process (e.g. a reactive ion etching process) that utilizes etchants suitable for the materials of the first gate electrode 106 and the first gate dielectric 104. Consequently, the first gate electrode 106 and the first gate dielectric 104 are patterned using the patterned first hard mask 108p as a mask. As described above, the result of this step is the removal of peripheral portions of the first gate electrode 106 and the first gate dielectric 104, while leaving behind the central portions of the first gate electrode 106 and the first gate dielectric 104. At the same time, portions of the first side 102a of the substrate 102 are exposed by the removal of peripheral portions of the first gate electrode 106 and the first gate dielectric 104, as shown in FIG. 1G.

Figure 1H:
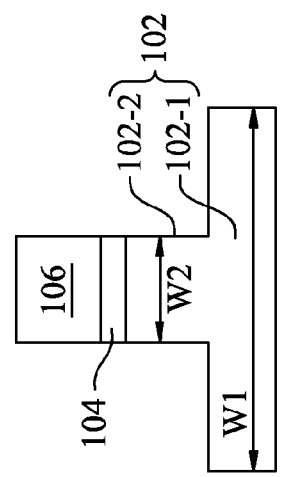

Referring to FIG. 1H, the pattern of the patterned first gate electrode 106 and first gate dielectric 104 may subsequently be transferred to the substrate 102 using a suitable etching process (e.g. RIE with anisotropic etching) that utilizes etchants suitable for the material of the substrate 102. In an embodiment, the etching process used to remove material of the substrate 102 may be similar to the etching process used in FIG. 1G to remove material of the first gate electrode 106 and the first gate dielectric 104. However, in another embodiment, the etching process used to remove material of the substrate 102 may be different from the etching process used in FIG. 1G to remove material of the first gate electrode 106 and the first gate dielectric 104. Following this, the patterned first hard mask 108p may be removed using, for example, a stripping process (e.g. a wet strip process) or an ashing process (e.g. plasma ashing process).

As a result of this process step, the substrate 102 is patterned to have a first portion 102-1 having a first width W1, and a second portion 102-2 having a second width W2 smaller than the first width W1. In an embodiment, the second width W2 may be in a range from about 5 nm to about 25 nm (e.g. in a range from about 7 nm to about 22 nm). As shown in FIG. 1H, the second portion 102-2 may protrude or extend from the first portion 102-1 of the substrate 102. The second width W2 may be substantially equal to the widths of the first gate electrode 106 and the first gate dielectric 104 overlying the second portion 102-2 of the substrate 102. In an embodiment, a channel length of the planar MOSFET manufactured using the process flow shown in FIGS. 1A to 1M may have a channel length substantially equal to the second width W2.

Referring to FIG. 1I, first isolation layers 112 may be formed on surfaces of the first portion 102-1 of the substrate 102 facing away from the second side 102b of the substrate 102. For example, the first isolation layers 112 may be formed on surfaces of the first portion 102-1 of the substrate 102 proximal sidewalls 102-2w of the second portion 102-2 of the substrate 102. These surfaces may be major surfaces of the first portion 102-1 of the substrate 102. The first isolation layers 112 may function to provide electrical isolation between the substrate 102 and source/drain regions that are subsequently formed over the first isolation layers 112 and adjacent to the sidewalls 102-2w of the second portion 102-2 of the substrate 102 (e.g. see description below in respect of FIG. 1J). The first isolation layers 112 may comprise an insulating material such as a dielectric material (e.g. an oxide, a nitride, or multilayers thereof).

The first isolation layers 112 may be formed by a deposition process such as a PECVD process, a high density plasma CVD (HDPCVD) process, combinations thereof, or the like. In some embodiments, the deposition process may conformally deposit the first isolation layers 112 on the sidewalls 102-2w of the second portion 102-2 of the substrate 102 as well as on the surfaces of the first portion 102-1 of the substrate 102 facing away from the second side 102b of the substrate 102. In such an embodiment, a thickness of the first isolation layers 112 on the sidewalls 102-2w of the second portion 102-2 of the substrate 102 may be smaller than a thickness of the first isolation layers 112 on the surfaces of the first portion 102-1 of the substrate 102 facing away from the second side 102b of the substrate 102. For example, the thickness of the first isolation layers 112 on the sidewalls 102-2w may be about 25 percent to about 35 percent the thickness of the first isolation layers 112 on the surfaces of the first portion 102-1 of the substrate 102 facing away from the second side 102b of the substrate 102. Consequently, a cleaning process (e.g. a wet clean process) comprising the use of an etchant, such as hydrofluoric acid (HF) or diluted hydrofluoric acid (DHF), may be used to remove portions of the first isolation layers 112 disposed on the sidewalls 102-2w, while leaving behind portions of the first isolation layers 112 on the surfaces of the first portion 102-1 of the substrate 102 facing away from the second side 102b of the substrate 102. In an embodiment, the thickness of the first isolation layers 112 on the surfaces of the first portion 102-1 of the substrate 102 facing away from the second side 102b of the substrate 102 may be in a range from about 3 nm to about 10 nm.

Referring to FIG. 1J, first source/drain regions 114 may be epitaxially formed over the first isolation layers 112 and adjacent to the sidewalls 102-2w of the second portion 102-2 of the substrate 102. The first source/drain regions 114 may comprise a semiconductor material that also comprises dopants that causes the first source/drain regions 114 to have conductivity different from the conductivity of the substrate 102. For example, in an embodiment where the semiconductor device being manufactured is a PMOS device, the semiconductor material of the first source/drain regions 114 may contain P-type dopants (such as indium). However, in an embodiment where the semiconductor device being manufactured is an NMOS device, the semiconductor material of the first source/drain regions 114 may contain N-type dopants (such as phosphorous or arsenic). A dopant concentration of the first source/drain regions 114 may be greater than the dopant concentration of the substrate 102. For example, the dopant concentration of the first source/drain regions 114 may be in a range from about $1 \times 10^{19}$ cm$^{-3}$ to about $1 \times 10^{22}$ cm$^{-3}$ or even greater. The channel length of the planar MOSFET manufactured using the process flow shown in FIGS. 1A to 1M may be measured as a distance first source/drain regions 114, which as described above, may be substantially equal to the second width W2, which may be in a range from about 5 nm to about 25 nm (e.g. in a range from about 7 nm to about 22 nm).

The first source/drain regions 114 may be formed using an epitaxial growth process. The epitaxial growth process may be molecular beam epitaxy (MBE), liquid phase epitaxy (LPE), vapor phase epitaxy (VPE), selective epitaxial growth (SEG), or combinations thereof. The epitaxial growth process utilizes exposed regions of the second portion 102-2 of the substrate 102 as a growth initiator. For example, the epitaxial growth may utilize exposed portions of the sidewalls 102-2w of the second portion 102-2 of the substrate 102 as the growth initiator. In some embodiments, the epitaxial growth process may initially proceed in a direction away from (e.g. perpendicularly away from) the sidewalls 102-2w of the second portion 102-2 of the substrate 102. Such an initial direction of epitaxial growth is indicated in FIG. 1J as dashed arrows 116. As the epitaxial growth process proceeds, however, subsequently-grown semiconductor material of the first source/drain regions 114 may proceed along lattice plane orientations of previously-grown semiconductor material of the source/drain regions 114. Since the growth rate of semiconductor material may depend on the lattice plane orientations, top surfaces of the first source/drain regions 114 may have facets F that are inclined, e.g. with respect to a horizontal reference.

In an embodiment, the dopants are introduced into the semiconductor material of the first source/drain regions 114 while the first source/drain regions 114 are grown. As an example, during the epitaxial growth process of the source/drain regions 114, precursors that comprise the desired dopants are placed in situ into a reaction vessel along with the precursor reactants for the semiconductor material of the source/drain regions 114. As such, the dopants are introduced and incorporated into the semiconductor material of the first source/drain regions 114 to provide the first source/drain regions 114 the desired conductivity while the first source/drain regions 114 are grown. In this embodiment, the dopant concentration may be substantially uniform throughout the source/drain regions 114.

Alternatively, in another embodiment, the dopants may be introduced into the semiconductor material of the first source/drain regions 114 after the first source/drain regions 114 are grown. As an example, the semiconductor material of the first source/drain regions 114 may be grown without the dopants, and an introduction process such as an implantation process or diffusion process is utilized to introduce the dopants into the source/drain regions 114. Once the dopants have been introduced into the source/drain regions 114, an anneal process may be performed to activate the dopants. In this embodiment, the first source/drain regions 114 may have a graded dopant concentration, where the dopant concentration is higher at regions of the first source/drain regions 114 distal the first isolation layers 112, while the dopant concentration is lower at regions of the first source/drain regions 114 proximal the first isolation layers 112.

The epitaxial growth of the first source/drain regions 114 may continue at least until the sidewalls 102-2w of the second portion 102-2 of the substrate 102 are covered by the semiconductor material of the first source/drain regions 114 and the top surfaces of the first source/drain regions 114 are disposed at least at the same level as a top surface of the second portion 102-2 of the substrate 102.

Referring to FIG. 1K, gate spacers 118 are formed along sidewalls of the first gate dielectric 104 and the first gate electrode 106 using, for example, a conformal deposition process followed by an etching process (e.g. an anisotropic etching process). The gate spacers 118 may comprise a dielectric material, such as silicon nitride, SiCN, a combination thereof, or the like.

Referring to FIG. 1L, first silicide regions 120 may be formed over surfaces of the first source/drain regions 114 facing away from the substrate 102. For example, the first silicide regions 120 may be formed on the top surfaces of the source/drain regions 114. Also shown in FIG. 1L is a second silicide region 122 formed on a surface of the first gate electrode 106 facing away from the substrate (e.g. a top surface of the first gate electrode 106). The first silicide regions 120 and the second silicide region 122 may comprise silicide compounds of titanium (e.g. $TiSi_2$), cobalt (e.g. $CoSi_2$), nickel (e.g. NiSi), combinations thereof, or the like. The first silicide regions 120 and the second silicide region 122 may be formed using a silicide process or other suitable method.

Referring to FIG. 1M, dielectric material 124 (e.g. comprising an oxide and/or a nitride) may be deposited over the first silicide regions 120 and the second silicide region 122 and may fully cover the gate spacers 118, e.g. on all sides of the gate spacers 118, as shown in FIG. 1M. The dielectric material 124 may, as an example, form an interlayer dielectric (ILD) layer of the semiconductor device that is manufactured using the process flow shown in FIGS. 1A to 1M.

Following this, contacts (comprising an electrically conductive material) may be formed in the dielectric material 124 to make electrical contact with the first silicide regions 120 and the second silicide region 122. Furthermore, an interconnect layer comprising one or more inter-metal dielectric (IMD) layers and conductive structures formed therein may be manufactured over the dielectric material 124. The conductive structures in the IMD layers of the interconnect layer may electrically connect to the contacts formed in the dielectric material 124 (e.g. the ILD layer). These structures and process steps are not shown for the sake of brevity.

The process flow shown in FIGS. 1A to 1M may, for example, be a gate-first process that may be used to manufacture a planar MOSFET. However, the various processes illustrated in FIGS. 1A to 1M may also be used to manufacture a planar MOSFET using a gate-last process. Some of the intermediary steps of such a process flow are shown in FIGS. 2A to 2P.

Figure 2A:
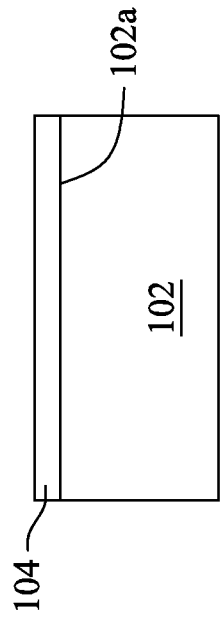
FIGS. 2A to 2P show a method illustrating various intermediary steps of manufacturing a planar MOSFET using a gate-last process, in accordance with some embodiments.
Figure 2B:
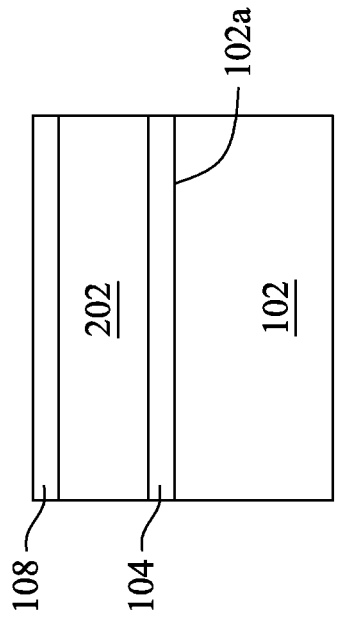
Figure 2C:
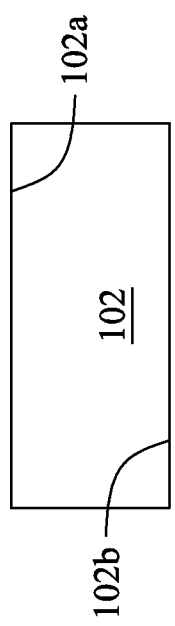
Figure 2D:
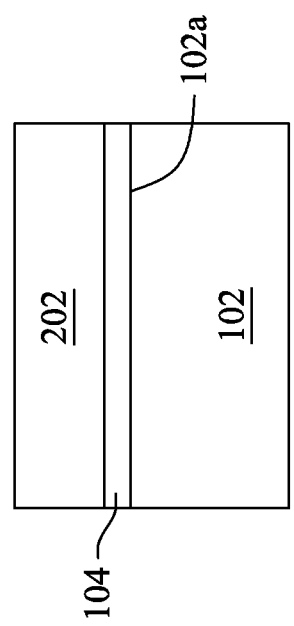
Figure 2E:
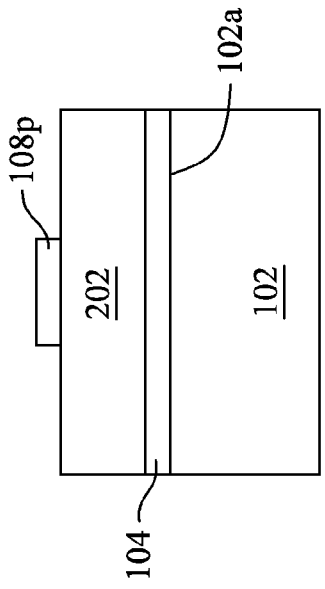
Figure 2F:
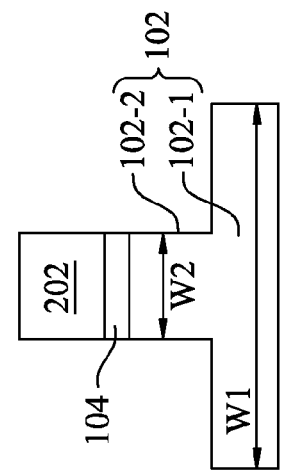
Figure 2G:
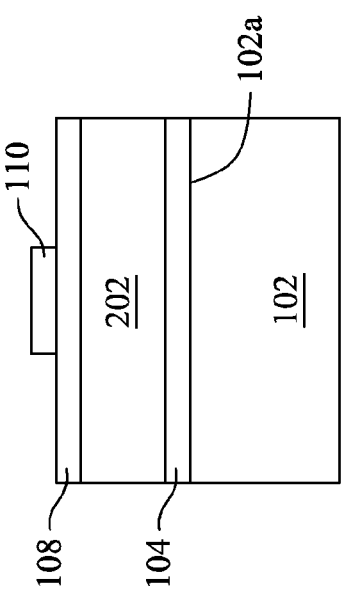

FIGS. 2A and 2B show the substrate 102 and the first gate dielectric 104 formed over the first side 102a of the substrate 102. As shown in FIG. 2C, a first dummy gate 202 may be formed over the first gate dielectric 104 to a suitable thickness, e.g. in a range from about 10 nm to about 50 nm. The first dummy gate 202 may be formed using a similar process as described above in respect of the first gate electrode 106. In an embodiment, the first dummy gate 202 may comprise undoped (or unintentionally doped) polysilicon. Since the process flow shown in FIGS. 2A to 2P is a gate-last process, the first dummy gate 202 may be replaced at a later step by a gate replacement process (e.g. see description below in respect of FIGS. 2N and 2O).

As shown in FIGS. 2D to 2G, peripheral portions of the first dummy gate 202 and the first gate dielectric 104 are removed, while leaving behind the central portions of the first dummy gate 202 and the first gate dielectric 104. The process flow shown in FIGS. 2D to 2G used to remove the peripheral portions of the first dummy gate 202 and the first gate dielectric 104 may be similar to the processes used for removing peripheral portions of the first gate electrode 106 and the first gate dielectric 104 (e.g. described above in respect of FIGS. 1D to 1G). For example, a masking and etching process may be used to remove the peripheral portions of the first dummy gate 202 and the first gate dielectric 104.

Figure 2H:
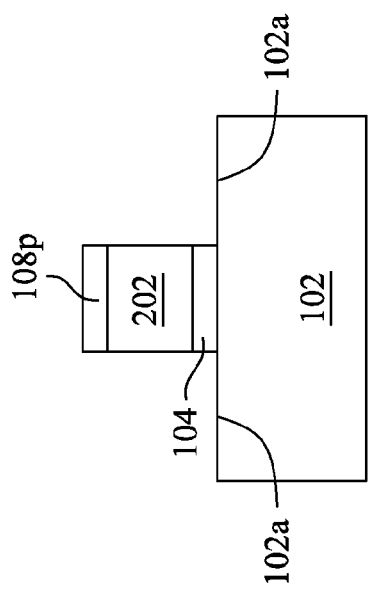

Referring to FIG. 2H, the pattern of the patterned first dummy gate 202 and first gate dielectric 104 may subsequently be transferred to the substrate 102 using an etching process similar to that described above in respect of FIG. 1H. For example, in transferring the pattern of the patterned first dummy gate 202 and first gate dielectric 104 to the substrate 102, the substrate 102 may be patterned to have the second portion 102-2 extending or protruding from the first portion 102-1.

Figure 2I:
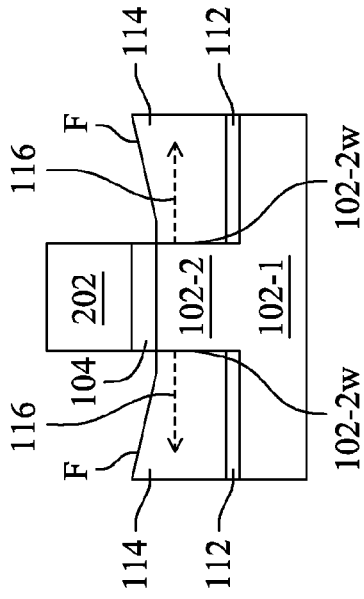
Figure 2J:
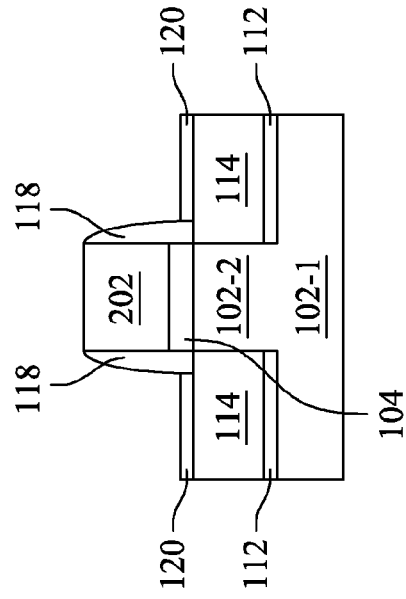
Figure 2K:
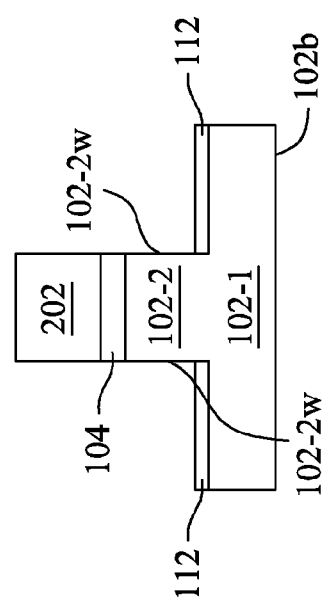

Subsequently, the process flow may proceed in a similar manner and using similar processes as described above in respect of FIGS. 1I to 1K. For example, as shown in FIG. 2I, the first isolation layers 112 may be formed on surfaces of the first portion 102-1 of the substrate 102 proximal sidewalls 102-2w of the second portion 102-2 of the substrate 102. Referring to FIG. 2J, the first source/drain regions 114 may be epitaxially formed over the first isolation layers 112 and adjacent to the sidewalls 102-2w of the second portion 102-2 of the substrate 102. Referring to FIG. 2K, the gate spacers 118 are formed along sidewalls of the first gate dielectric 104 and the first dummy gate 202 using, for example, a conformal deposition process followed by an etching process (e.g. an anisotropic etching process).

Figure 2L:
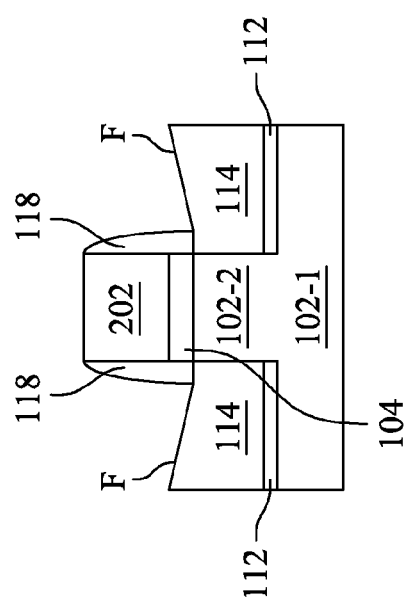

As shown in FIG. 2L, the first silicide regions 120 may then be formed over surfaces of the first source/drain regions 114 facing away from the substrate 102. For example, the first silicide regions 120 may be formed on top surfaces of the source/drain regions 114. However, in contrast to the process step shown in FIG. 1L, the second silicide region 122 is not formed on a surface (e.g. a top surface) of the first dummy gate 202 since the first dummy gate 202 has to be replaced with the first gate electrode 106 using a gate replacement process (e.g. see description below in respect of FIGS. 2N and 2O).

Figure 2M:
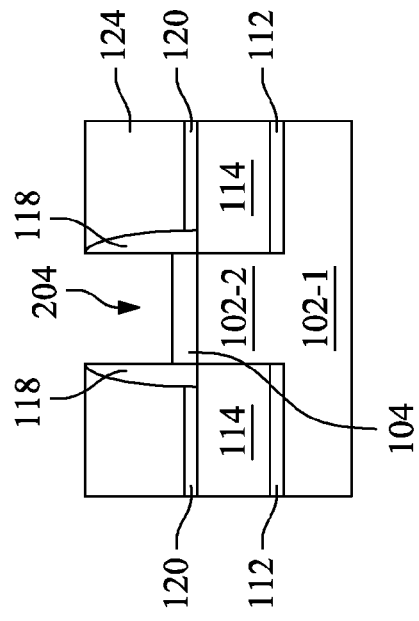
Figure 2N:
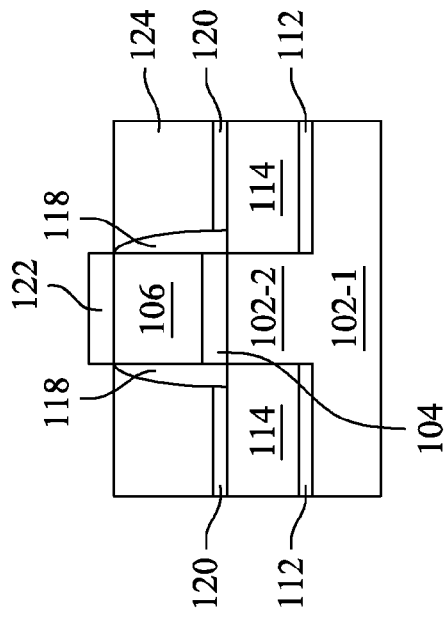

Referring to FIG. 2M, the dielectric material 124 (e.g. ILD layer) may be deposited over the first silicide regions 120 and may fully cover the gate spacers 118. In an embodiment, surfaces of the dielectric material 124 and the first dummy gate 202 facing away from the substrate 102 (e.g. the top surfaces of the dielectric material 124 and the first dummy gate 202) may be substantially co-planar, e.g. as a result of a planarizing process (such as a chemical mechanical polishing) that is performed on the dielectric material 124. Subsequently, as shown in FIG. 2N, the first dummy gate 202 may be removed (e.g. using an etching process), thereby forming a trench 204 in the dielectric material 124. The trench 204 may expose the first gate dielectric 104, as shown in FIG. 2N.

Figure 2O:
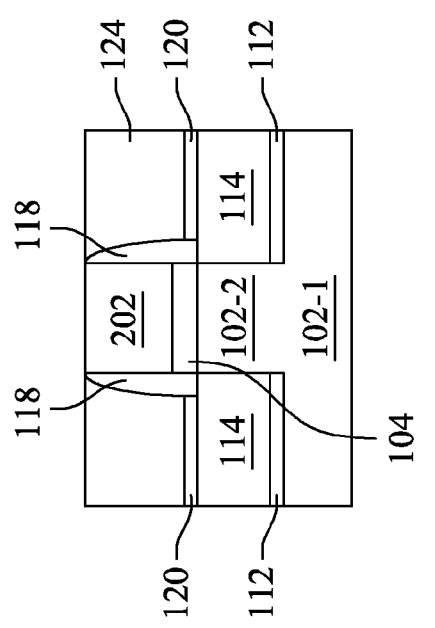
Figure 2P:
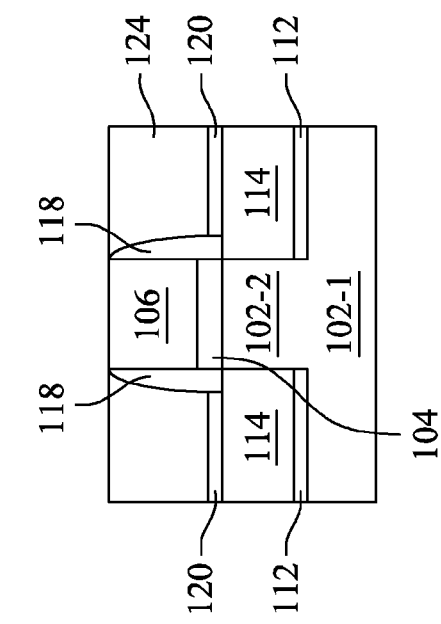

Referring to FIG. 2O, the first gate electrode 106 may be formed in the trench 204 by filling the trench 204 with conductive material. The process used to fill the trench 204 may, as an example, be similar to the process used in FIG. 1C to form the first gate electrode 106 over the first gate dielectric 104. In some embodiments, the trench 204 may be overfilled with conductive material such that conductive material is also disposed over surfaces of the dielectric material 124 facing away from the substrate 102 (e.g. top surfaces of the dielectric material 124). Thereafter, a planarizing process, such as a chemical mechanical polishing, may be used to remove the conductive material disposed on the top surfaces of the dielectric material 124. As a result, surfaces of the dielectric material 124 and the first gate electrode 106 may be substantially co-planar.

Referring to FIG. 2P, the second silicide region 122 is then formed on a surface of the first gate electrode 106 facing away from the substrate (e.g. a top surface) using a similar process as described above in relation to FIG. 1L. Following this, the interconnect layer comprising one or more IMD layers and conductive structures formed therein may be manufactured over the dielectric material 124 and the second silicide region 122. Furthermore, contacts (comprising an electrically conductive material) may be formed in the dielectric material 124 to make electrical contact with the first silicide regions 120 and the second silicide region 122. These structures and process steps are not shown for the sake of brevity.

The channel length of the planar MOSFET manufactured using the process flow shown in FIGS. 1A to 1M and 2A to 2P may be measured as a distance first source/drain regions 114, which as described above, may be substantially equal to the second width W2, which may be in a range from about 5 nm to about 25 nm (e.g. in a range from about 7 nm to about 22 nm). In typical planar MOSFETS, channel lengths in such a range may give rise to short channel effects (SCE), parasitic capacitances between the substrate 102 and the first source/drain regions 114, and source/drain leakage current caused by high doping of the first source/drain regions 114, as an example. However, the planar MOSFETs manufactured using the process flow shown in FIGS. 1A to 1M and FIGS. 2A to 2P comprises the first isolation layers 112, which leads to SCE improvement, lower source/drain parasitic capacitance, and lower source/drain junction leakage. These, in turn, can lead to robust logic circuit performance. Furthermore, the methods used to form the first isolation layers 112 provide a cost-effective method of forming a partial silicon-on-insulator (SOI) wafer and manufacturing planar MOSFETs over an insulator layer of the partial SOI wafer (e.g. over the first isolation layers 112) and in the semiconductor layer of the partial SOI wafer (e.g. in the second portion 102-2 of the substrate 102).

Figure 3A:
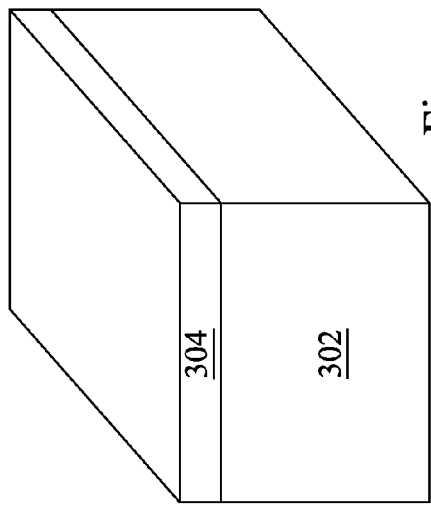

The effects provided by the process flow shown in FIGS. 1A to 1M and FIGS. 2A to 2P may also be provided to a fin field effect transistor (FinFET) device. FIGS. 3A to 3L show a method illustrating various intermediary steps of manufacturing a FinFET using a gate-first process, in accordance with some embodiments. FIG. 3A shows a substrate 302, which may be similar to the substrate 102 described above in respect of FIG. 1A. The substrate 302 may comprise a doped semiconductor material. In an embodiment where the FinFET being manufactured is a PMOS device, the semiconductor material of the substrate 302 may contain N-type dopants (such as phosphorous or arsenic). However, in an embodiment where the FinFET being manufactured is an NMOS device, the semiconductor material of the substrate 302 may contain P-type dopants (such as indium). A dopant concentration of the semiconductor material of the substrate 302 may be less than about $1\times10^{18}$ cm$^{-3}$ (e.g. in a range from about $1\times10^{12}$ cm$^{-3}$ to about $1\times10^{16}$ cm$^{-3}$) As another example, for scaling devices, the dopant concentration can be controlled to be in a range from about $1\times10^{16}$ cm$^{-3}$ to about $1\times10^{18}$ cm$^{-3}$. However, it is noted that other dopant concentrations may be possible as well. In some of the subsequent process steps, a masking and etching process may be performed on the substrate 302, e.g. to form fin structures.

Figure 3B:
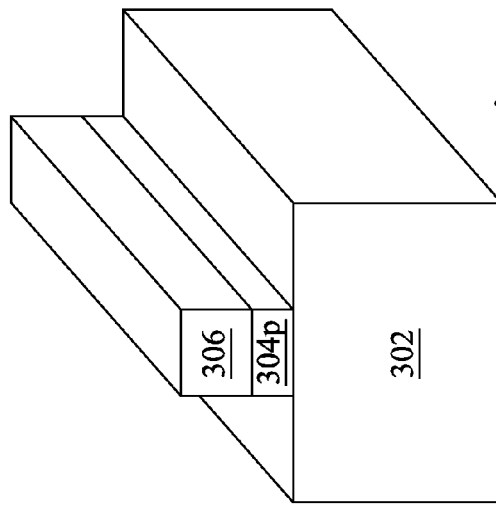

Referring to FIG. 3B, a second hard mask 304 may be formed over the substrate 302. The second hard mask 304 may comprise similar materials and may be formed using similar methods as the first hard mask 108 (e.g. shown in FIG. 1D). Once the second hard mask 304 has been formed, peripheral portions of the second hard mask 304 may be removed in order to expose peripheral portions of the substrate 302.

Figure 3C:
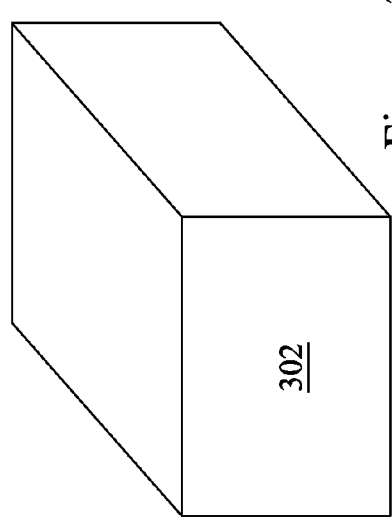
Figure 3D:
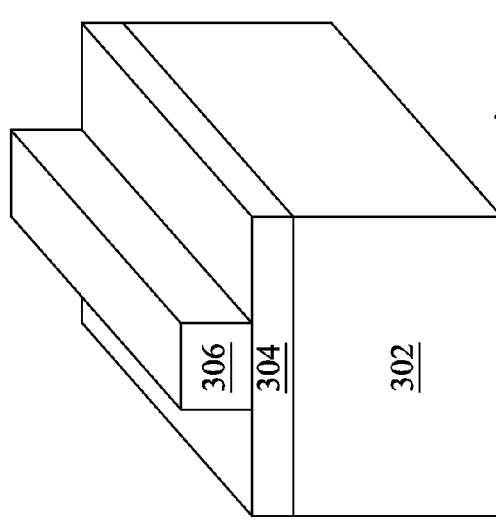

As shown in the example of FIG. 3C, the second hard mask 304 may be patterned by initially forming a patterned second photoresist 306 over a central portion of the second hard mask 304, while peripheral portions of the second hard mask 304 are free from the patterned second photoresist 306. The patterned second photoresist 306 may comprise materials similar materials and may be formed using similar methods as the patterned first photoresist 110.

Following the formation of the patterned second photoresist 306, the second hard mask 304 may be patterned using the patterned second photoresist 306 as a mask. In other words, the peripheral portions of the second hard mask 304 may be removed, while leaving behind the central portion of the second hard mask 304, e.g. the portion of the second hard mask 304 disposed beneath the patterned second photoresist 306. The result of this processing step is a patterned second hard mask 304p, shown in FIG. 3D. In an embodiment, an etching process (e.g. a reactive ion etching process) that utilizes etchants suitable for the material of the second hard mask 304 may be used to pattern the second hard mask 304. However, other suitable processes for patterning the second hard mask 304 may also be used. The patterning of the second hard mask 304 may continue until surfaces of the peripheral regions of the substrate 302 are exposed. Following this, the patterned second photoresist 306 may be removed using, for example, a stripping process (e.g. a wet strip process) or an ashing process (e.g. plasma ashing process).

Thereafter, as shown in FIG. 3E, the pattern of the patterned second hard mask 304p may be transferred to the substrate 302 using a suitable etching process (e.g. a reactive ion etching process) that utilizes etchants suitable for the materials of the substrate 302. The substrate 302 may be patterned to have a fin structure 308 and a bottom semiconductor layer 310 below the fin structure 308. The fin structure 308 may extend from a major surface 310s of the bottom semiconductor layer 310. The etching of the substrate 302 may proceed until the fin structure 308 has a height H in a range from about 10 nm to about 50 nm. The height H may, as an example, be measured as the farthest extent of the fin structure 308 from the major surface 310s of the bottom semiconductor layer 310. The fin structure 308 may have a width W in a range from about 5 nm to about 20 nm (e.g. in a range from about 7 nm to about 15 nm). The width W may, as an example, be measured between opposing sidewalls 308w of the fin structure 308.

Referring to FIG. 3F, a second isolation layer 312 may be formed over the patterned second hard mask 304p, the major surface 310s of the bottom semiconductor layer 310, and the sidewalls 308w of the fin structure 308. For example, the second isolation layer 312 may surround the fin structure 308 and completely cover the patterned second hard mask 304p and the major surface 310s of the bottom semiconductor layer 310. The second isolation layer 312 may function to provide electrical isolation between the fin structure 308 and another fin structure adjacent to the fin structure 308. The second isolation layer 312 may comprise a dielectric material (e.g. an oxide, a nitride, or multilayers thereof). For example, the second isolation layer 312 may comprise silicon nitride, silicon oxynitride, fluoride-doped silicate glass (FSG), or a low-K dielectric material. The second isolation layer 312 may be formed by a deposition process such as a PECVD process, a high density plasma CVD (HDPCVD) process, combinations thereof, or the like. In the embodiment where the second isolation layer 312 is formed by a HDPCVD process, silane ($SiH_4$) and oxygen ($O_2$) may be used as reacting precursors. In other embodiment, the second isolation layer 312 may be formed using a sub-atmospheric CVD (SACVD) process or high aspect-ratio process (HARP), wherein process gases may comprise tetraethylorthosilicate (TEOS) and ozone ($O_3$). In yet other embodiment, the second isolation layer 312 may be formed using a spin-on-dielectric (SOD) process, such as hydrogen silsesquioxane (HSQ) or methyl silsesquioxane (MSQ).

Referring to FIG. 3G, a planarizing process (e.g. a chemical mechanical polishing) may be performed to planarize the second isolation layer 312, followed by the removal of the patterned second hard mask 304p. In one embodiment, the patterned second hard mask 304p may be removed using, for example, a stripping process (e.g. a wet strip process) or an ashing process (e.g. plasma ashing process).

Referring to FIG. 3H, a portion of the second isolation layer 312 may be recessed to expose a first portion 308-1 (e.g. an upper portion) of the fin structure 308, while a second portion 308-2 (e.g. a lower portion) of the fin structure 308 remains covered by the second isolation layer 312. In some embodiments, the remaining portion of the second isolation layer 312 that surrounds the fin structure 308 is referred to as a device isolation structure 312. In some embodiments, the recessing of the second isolation layer 312 may be performed using a wet etching process, for example, by dipping the structure shown in FIG. 3G in a liquid etchant (e.g. hydrofluoric acid (HF)). In some embodiments, the etching step may be performed using a dry etching process, for example, the dry etching process may be performed using $CHF_3$ or $BF_3$ as etching gases.

Figure 3I:
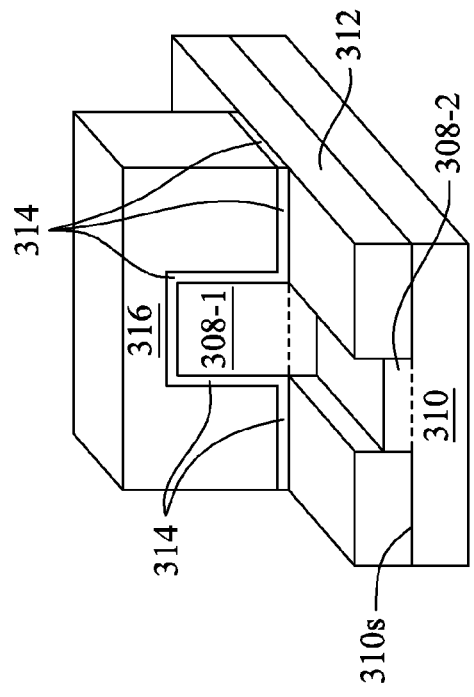

Referring to FIG. 3I, a second gate dielectric 314 and a second gate electrode 316 may be formed (e.g. conformally formed) over a region of the first portion 308-1 of the fin structure 308. The second gate dielectric 314 and the second gate electrode 316 may comprise similar materials as the first gate dielectric 104 and the first gate electrode 306, respectively. The second gate dielectric 314 and the second gate electrode 316 may be formed by a deposition process (e.g. a low-pressure chemical vapor deposition (LPCVD) process) that forms material of the second gate dielectric 314 and the second gate electrode 316 over an entire extent of the first portion 308-1 of the fin structure 308. This may be followed by a masking and etching process that patterns the material of the second gate dielectric 314 and the second gate electrode 316 such that a first region of the first portion 308-1 of the fin structure 308 is covered by the second gate dielectric 314 and the second gate electrode 316, and a second region of the first portion 308-1 of the fin structure 308 remains exposed.

Figure 3J:
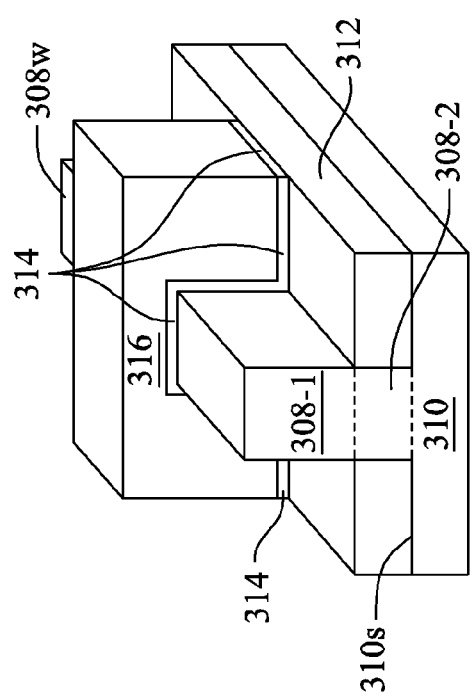

Referring to FIG. 3J, regions of the first portion 308-1 of the fin structure 308 disposed outside a lateral extent of the second gate dielectric 314 and the second gate electrode 316 may be removed (e.g. using an etching process). Furthermore, an upper region the second portion 308-2 of the fin structure 308 may also be removed. The etching process used to remove material of the fin structure 308 may be any suitable etching process (e.g. reactive ion etching process) that utilizes etchants suitable for the material of the fin structure 308. In some embodiments, the second gate dielectric 314 and the second gate electrode 316 may act as masks during this etching process.

Figure 3K:
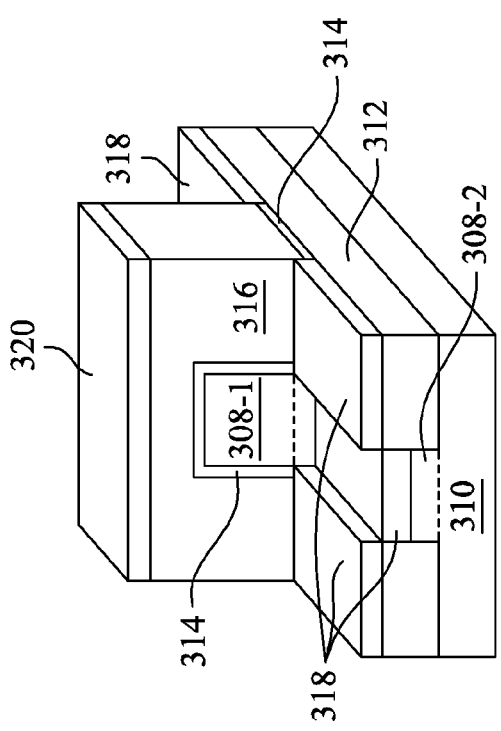

Referring to FIG. 3K, a third isolation layer 318 may be formed on surfaces of the device isolation structure 312 facing away from the major surface 310s of the bottom semiconductor layer 310. A fourth isolation layer 320 may also be formed over a top surface of the second gate electrode 316. The third isolation layer 318 may function to provide electrical isolation between the substrate 305 and source/drain regions that are subsequently formed over the third isolation layer 318 and adjacent to sidewalls of the first portion 308-1 of the fin structure 308 disposed within a width of the second gate dielectric 314 and the second gate electrode 316. In some embodiments, the first portion 308-1 of the fin structure 308 disposed within the width of the second gate dielectric 314 and the second gate electrode 316 comprises a channel region of the FinFET being manufactured.

The third isolation layer 318 and the fourth isolation layer 320 may comprise similar materials and may be formed using similar processes as the first isolation layers 112. For example, in some embodiments, the deposition process used to form the third isolation layer 318 may conformally deposit material on the sidewalls of the second gate dielectric 314 and the second gate electrode 316 as well as on surfaces of the first portion 308-1 of the fin structure 308 disposed within the width of the second gate dielectric 314 and the second gate electrode 316. However, a thickness of the third isolation layer 318 on these surfaces may be smaller than a thickness of the third isolation layer 318 on the surfaces of the device isolation structure 312 facing away from the major surface 310s of the bottom semiconductor layer 310. Consequently, a cleaning process (e.g. a wet clean process) comprising the use of an etchant, such as hydrofluoric acid (HF) or diluted hydrofluoric acid (DHF), may be used to remove portions of the third isolation layer 318 disposed on the sidewalls of the second gate dielectric 314 and the second gate electrode 316 as well as on surfaces of the first portion 308-1 of the fin structure 308 disposed within the width of the second gate dielectric 314 and the second gate electrode 316, while leaving behind portions of the third isolation layer 318 on surfaces of the device isolation structure 312 facing away from the major surface 310s of the bottom semiconductor layer 310. In an embodiment, the thickness of the third isolation layer 318 on the surfaces of the device isolation structure 312 facing away from the major surface 310s of the bottom semiconductor layer 310 may be in a range from about 3 nm to about 10 nm.

Figure 3L:
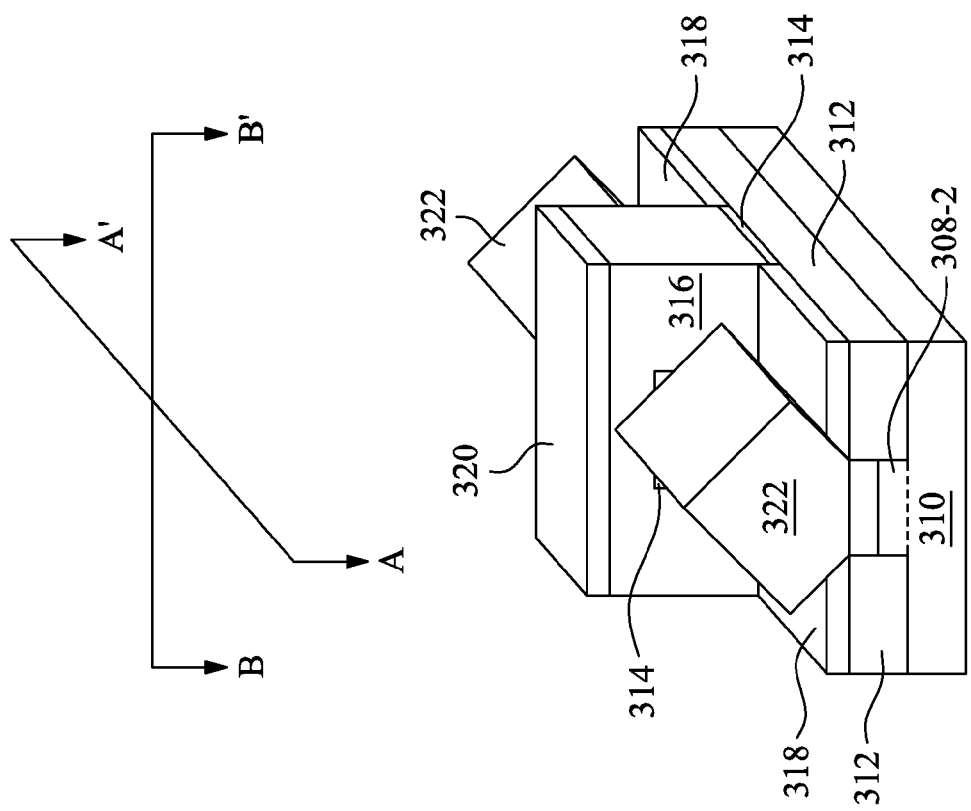

Referring to FIG. 3L, second source/drain regions 322 may be epitaxially formed over the third isolation layer 318 and adjacent to the exposed surfaces (e.g. exposed sidewalls) of the first portion 308-1 of the fin structure 308 disposed within the width of the second gate dielectric 314 and the second gate electrode 316. The second source/drain regions 322 may comprise similar materials as the first source/drain regions 114. The second source/drain regions 322 may have a conductivity different from the conductivity of the first portion 308-1 of the fin structure 308. For example, in an embodiment where the semiconductor device being manufactured is a PMOS device, the semiconductor material of the second source/drain regions 322 may contain P-type dopants (such as indium). However, in an embodiment where the semiconductor device being manufactured is an NMOS device, the semiconductor material of the second source/drain regions 322 may contain N-type dopants (such as phosphorous or arsenic). A dopant concentration of the second source/drain regions 322 may be greater than the dopant concentration of the substrate 302. For example, the dopant concentration of the second source/drain regions 322 may be in a range from about $1\times10^{19}$ cm$^{-3}$ to about $1\times10^{22}$ cm$^{-3}$ or even greater.

The second source/drain regions 322 may be formed using similar methods as the first source/drain regions 114. For example, the second source/drain regions 322 may be formed using molecular beam epitaxy (MBE), liquid phase epitaxy (LPE), vapor phase epitaxy (VPE), selective epitaxial growth (SEG), or combinations thereof. The epitaxial growth process utilizes exposed surfaces of the first portion 308-1 of the fin structure 308 disposed within the width of the second gate dielectric 314 and the second gate electrode 316 as the growth initiator.

In an embodiment, the dopants are introduced into the semiconductor material of the second source/drain regions 322 as the second source/drain regions 322 are grown. As an example, during the epitaxial growth process of the second source/drain regions 322, precursors that comprise the desired dopants are placed in situ into a reaction vessel along with the precursor reactants for the semiconductor material of the second source/drain regions 322. As such, the dopants are introduced and incorporated into the semiconductor material of the second source/drain regions 322 to provide the second source/drain regions 322 the desired conductivity while the second source/drain regions 322 are grown. In this embodiment, the dopant concentration may be substantially uniform throughout the second source/drain regions 322.

The epitaxial growth of the second source/drain regions 322 may continue at least until the surfaces of the first portion 308-1 of the fin structure 308 disposed within the width of the second gate dielectric 314 and the second gate electrode 316 are covered by the semiconductor material of the second source/drain regions 322.

Figure 4B:
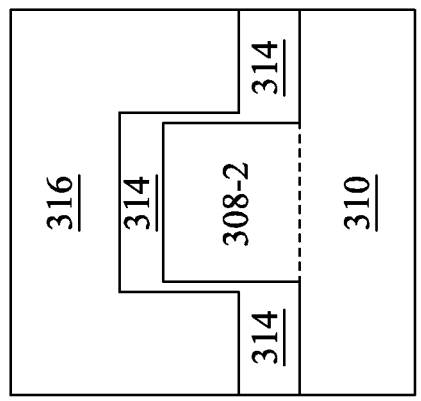
FIGS. 4A and 4B show various cross-sectional views of a FinFET, in accordance with some embodiments.
Figure 4A:
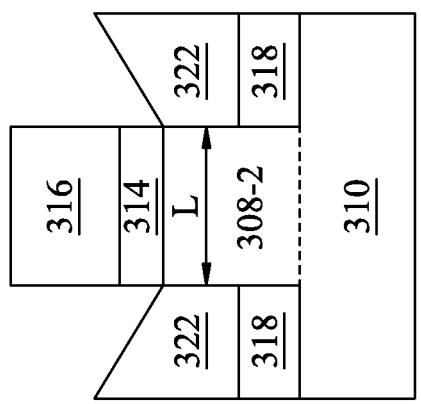

FIG. 4A shows a cross-sectional view of the FinFET shown in FIG. 3L along a line A-A'. The view shown in FIG. 4A may, as an example, be taken along a channel length direction of the FinFET shown in FIG. 3L. As shown in FIG. 4A, a channel length L may be measured as a distance between the second source/drain regions 322. In an embodiment, the channel length L may be in a range from about 5 nm to about 25 nm (e.g. in a range from about 7 nm to about 22 nm). FIG. 4B shows a cross-sectional view of the FinFET shown in FIG. 3L along a line B-B'. The view shown in FIG. 4A may, as an example, be taken along a channel width direction of the FinFET shown in FIG. 3L.

The process flow shown in FIGS. 3A to 3L may, for example, be a gate-first process that may be used to manufacture a FinFET. However, the various processes illustrated in FIGS. 3A to 3L may also be used to manufacture a FinFET using a gate-last process. Some of the intermediary steps of such a process flow are shown in FIGS. 5A to 5E.

FIG. 5A shows a portion of the second isolation layer 312 recessed to expose the first portion 308-1 (e.g. an upper portion) of the fin structure 308, while the second portion 308-2 (e.g. a lower portion) of the fin structure 308 remains covered by the second isolation layer 312. The structure shown in FIG. 5A may be identified with FIG. 3H, described above, and may be formed using similar processes as described above in respect of FIGS. 3A to 3H.

Figure 5E:
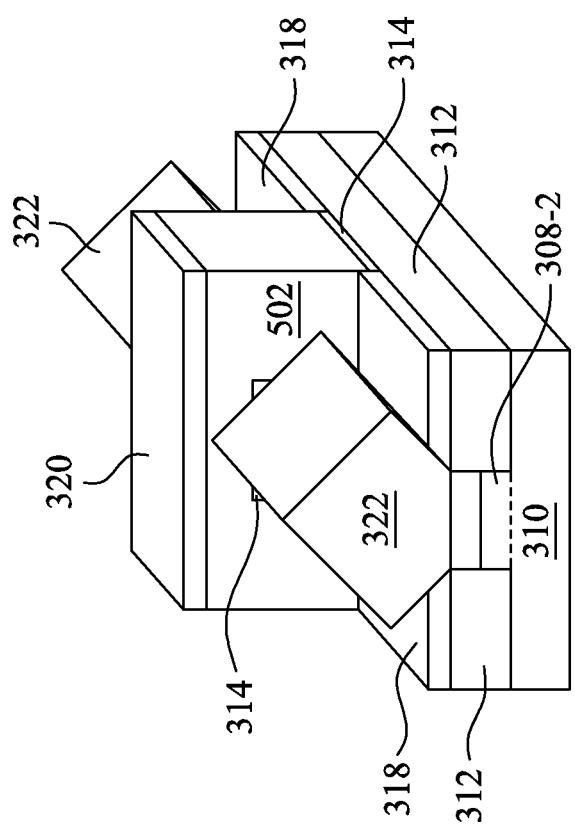

FIG. 5B shows the second gate dielectric 314 and a second dummy gate 502 formed (e.g. conformally formed) over the second gate dielectric 314. The second dummy gate 502 may comprise similar materials as the first dummy gate 202. The second gate dielectric 314 and the second dummy gate 502 may be formed by a deposition process (e.g. a low-pressure chemical vapor deposition (LPCVD) process) that forms material of the second gate dielectric 314 and the second dummy gate 502 over an entire extent of the first portion 308-1 of the fin structure 308. This may be followed by a masking and etching process that patterns the material of the second gate dielectric 314 and second dummy gate 502 such that a first region of the first portion 308-1 of the fin structure 308 is covered by the second gate dielectric 314 and the second dummy gate 502, and a second region of the first portion 308-1 of the fin structure 308 remains exposed. Since the process flow shown in FIGS. 5A to 5E is a gate-last process, the second dummy gate 502 may be replaced at a later step by a gate replacement process (e.g. see description below in respect of FIG. 5E).

Referring to FIG. 5C, regions of the first portion 308-1 of the fin structure 308 disposed outside a lateral extent of the second gate dielectric 314 and the second dummy gate 502 may be removed (e.g. using an etching process similar to that described above in respect of FIG. 3J). Referring to FIG. 5D, the third isolation layer 318 may be formed on surfaces of the device isolation structure 312 facing away from the major surface 310s of the bottom semiconductor layer 310. The fourth isolation layer 320 may also be formed over a top surface of the second dummy gate, e.g. using processes similar to those described above in respect of FIG. 3K. Referring to FIG. 5E, the second source/drain regions 322 may be epitaxially formed over the third isolation layer 318 and adjacent to the surfaces of the first portion 308-1 of the fin structure 308 disposed within the width of the second gate dielectric 314 and the second gate electrode 316, e.g. using processes similar to those described above in respect of FIG. 3L.

Following this, the structure shown in FIG. 5E may be covered with a dielectric material (e.g. ILD layer) using a deposition process. For example, the ILD layer may be formed over the surfaces of the second source/drain regions 322, the third isolation layer 318, the second dummy gate 502, and the fourth isolation layer 320. A planarizing process (such as a chemical mechanical polishing) may be performed on the ILD layer such that a top surface of the fourth isolation layer 320 is exposed. Subsequently, the fourth isolation layer 320 and the second dummy gate 502 may be removed (e.g. using an etching process), thereby forming a trench 204 in the ILD layer. This trench may be subsequently filled with conductive material, thereby forming the second gate electrode 316. These structures and process steps are not shown for the sake of brevity.

The channel length of the FinFET manufactured using the process flow shown in FIGS. 3A to 3L and FIGS. 5A to 5E may be measured as a distance second source/drain regions 322, which as described above, may be in a range from about 5 nm to about 25 nm (e.g. in a range from about 7 nm to about 22 nm). In typical FinFETS, channel lengths in such a range may give rise to short channel effects (SCE), parasitic capacitances between the bottom semiconductor layer 310 and the second source/drain regions 322, and source/drain leakage current caused by high doping of the second source/drain regions 322, as an example. However, the FinFETs manufactured using the process flow shown in Figures second source/drain regions 322 comprise the third isolation layers 318, which leads to SCE improvement, lower source/drain parasitic capacitance, and lower source/drain junction leakage. These, in turn, can lead to robust logic circuit performance. Furthermore, the methods used to form the third isolation layer 318 provide a cost-effective method of forming a partial silicon-on-insulator (SOI) wafer and manufacturing FinFETs over an insulator layer of the partial SOI wafer (e.g. over the third isolation layer 318) and in the semiconductor layer of the partial SOI wafer (e.g. the upper portion of the fin structure 308).

It is noted that the methods described herein may analogously be applied to the manufacture of isolation layers in a double gate CMOS devices, other FinFET devices, body-tied omega-gate CMOS devices, junctionless FET device, or the like, thereby leading to SCE improvement, lower source/drain parasitic capacitance, and lower source/drain junction leakage in such devices.

According to an embodiment presented herein, a method of manufacturing a semiconductor device is provided. The method may include: patterning a substrate to have a first region and a second region extending from the first region of the substrate; depositing an isolation layer over a surface of the first region of the substrate; and epitaxially forming source/drain regions over the isolation layer and adjacent to sidewalls of the second region of the substrate.

According to an embodiment presented herein, a method of manufacturing a semiconductor device is provided. The method may include: etching a substrate to have a first region and a second region extending from the first region of the substrate, the etching comprising using a gate structure as an etching mask; depositing an isolation layer over the first region of the substrate and over sidewalls of the second region of the substrate; removing the isolation layer disposed over the sidewalls of the second region of the substrate; and after the removing, epitaxially forming source/drain regions on the sidewalls of the second region of the substrate, the source/drain regions extending over the isolation layer disposed over the first region of the substrate.

According to an embodiment presented herein, a semiconductor device is provided. The semiconductor device may include: a substrate having a first region and a second region extending from the first region of the substrate; an isolation layer comprising a dielectric material disposed over surfaces of the first region of the substrate; source/drain regions physically contacting opposing first sidewalls of the second region of the substrate, the source/drain regions extending over the isolation layers; and a gate electrode disposed over at least a top surface of the second region of the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    patterning a substrate to have a first region, a second region extending from the first region of the substrate, and a third region adjacent the first region and the second region;
    depositing a first isolation layer over a surface of the third region of the substrate;
    depositing a second isolation layer over a surface of the first region of the substrate and a surface of the first isolation layer; and
    epitaxially forming source/drain regions over the second isolation layer and covering a portion of sidewalls of the second region of the substrate.

2. The method of claim 1, wherein the depositing the second isolation layer comprises at least one of a plasma enhanced chemical vapor deposition process or a high density plasma CVD chemical vapor deposition process.

3. The method of claim 1, wherein the second isolation layer has a thickness in a range from about 3 nanometers to about 10 nanometers.

4. The method of claim 1, wherein the second isolation layer comprises a dielectric material.

5. The method of claim 1, wherein the epitaxially forming the source/drain regions comprises at least one of molecular beam epitaxy (MBE), liquid phase epitaxy (LPE), vapor phase epitaxy (VPE), or selective epitaxial growth (SEG).

6. The method of claim 1, wherein the epitaxially forming the source/drain regions comprises placing precursors that comprise dopants in situ into a reaction vessel along with precursor reactants for a semiconductor material of the source/drain regions.

7. The method of claim 1, wherein the source/drain regions comprise a uniform dopant concentration in a range from about $1 \times 10^{19}$ cm$^{-3}$ to about $1 \times 10^{22}$ cm$^{-3}$.

8. The method of claim 1, wherein the patterning the substrate comprises:
    forming a first gate dielectric and a first gate structure over a planar surface of the substrate;
    patterning the first gate structure and the first gate dielectric to form a patterned first gate structure and a patterned first gate dielectric; and
    etching the substrate using the patterned first gate structure and the patterned first gate dielectric as an etching mask, the etching forming the first region and the second region of the substrate.

9. The method of claim 8, wherein the first gate structure comprises a first dummy gate.

10. The method of claim 8, wherein the first gate structure comprises a first gate electrode.

11. The method of claim 1, wherein the patterning the substrate comprises:
    forming a fin structure extending from a bottom semiconductor layer of the substrate;
    conformally forming a second gate dielectric and a second gate structure over surfaces of the fin structure;
    patterning the second gate dielectric and the second gate structure to form a patterned second gate dielectric and a patterned second gate structure; and
    removing portions of the fin structure disposed outside a lateral extent of the patterned second gate dielectric and the patterned second gate structure.

12. The method of claim 11, wherein the surface of the first region of the substrate comprises a surface of the substrate disposed outside the lateral extent of the patterned second gate dielectric and the patterned second gate structure.

13. A method of manufacturing a semiconductor device, the method comprising:
    etching a substrate to have a first region and a second region extending from the first region of the substrate, the etching comprising using a gate structure as an etching mask;
    depositing an isolation layer over the first region of the substrate and over sidewalls of the second region of the substrate;
    removing the isolation layer disposed over the sidewalls of the second region of the substrate; and after the removing, epitaxially forming source/drain regions on the sidewalls of the second region of the substrate, the source/drain regions extending over the isolation layer disposed over the first region of the substrate.

14. The method of claim 13, wherein the semiconductor device comprises a planar metal oxide semiconductor field effect transistor.

15. The method of claim 13, wherein the semiconductor device comprises a fin field effect transistor.

16. The method of claim 13, wherein the removing the isolation layer disposed over the sidewalls of the second region of the substrate comprises a wet clean process.

17. A semiconductor device, comprising:
a substrate having a first region and a second region extending from the first region of the substrate;
an isolation layer comprising a dielectric material disposed over surfaces of the first region of the substrate, wherein the isolation layer has a substantially uniform height above the first region of the substrate;
source/drain regions physically contacting opposing first sidewalls of the second region of the substrate, the source/drain regions extending completely over a top surface of the isolation layer over the first region; and
a gate electrode disposed over at least a top surface of the second region of the substrate.

18. The semiconductor device of claim 17, wherein a distance between the opposing first sidewalls of the second region of the substrate is in a range from about 5 nanometers to about 25 nanometers.

19. The semiconductor device of claim 17, wherein the source/drain regions comprise a uniform dopant concentration in a range from about $1 \times 10^{19}$ cm$^{-3}$ to about $1 \times 10^{22}$ cm$^{-3}$.

20. The semiconductor device of claim 17, wherein the gate electrode is further disposed over opposing second sidewalls of the second region of the substrate.

* * * * *